US006526375B1

United States Patent
Frankel et al.

(10) Patent No.: US 6,526,375 B1
(45) Date of Patent: Feb. 25, 2003

(54) SELF-CONFIGURING STORE-AND-FORWARD COMPUTER NETWORK

(75) Inventors: James L. Frankel, Lexington, MA (US); David B. Anderson, Belmont, MA (US); Joseph W. Marks, Belmont, MA (US); Edmund M. Sullivan, Miami, FL (US)

(73) Assignee: Mitsubishi Electric Research Laboratories, INC, Cambridge, MA (US)

( * ) Notice: Subject to any disclaimer, the term of this patent is extended or adjusted under 35 U.S.C. 154(b) by 0 days.

(21) Appl. No.: 09/298,235

(22) Filed: Apr. 23, 1999

(51) Int. Cl.[7] .......................... G06F 9/44; G06F 13/10; G06F 13/12
(52) U.S. Cl. .............. 703/21; 712/11; 712/12
(58) Field of Search ................... 446/91; 712/11; 703/1, 13, 14, 21; 707/5; 717/106

(56) References Cited

U.S. PATENT DOCUMENTS

| 4,275,449 A | 6/1981 | Aish | 364/512 |
| 4,883,440 A | * 11/1989 | Bolli | 446/91 |

FOREIGN PATENT DOCUMENTS

GB 2201817 A * 9/1988

OTHER PUBLICATIONS

Dewey et al., "Geometry Defining Processors for Partial Differential Equations", Special Purpose Computers, 1988.*
Barton et al., "The computing surface", International specialist seminar on the design and application of parallel digital processors, 1988*
G. Anagnostou, D. Dewey and A. Patera; "Geometry–Defining Processors for Engineering Design and Analysis"; *The Visual Computer* (1989) 5; pp. 304–315.
D. Dewey and A. Patera; "Geometry–Defining Processors for Partial Differential Equations"; In: Alder BJ (ed) *Special Purpose Computers*; Academic Press, pp. 67–96.
John Frazer; *Themes VII: An Evolutionary Architecture*; Architectual Association (London) Publications; 1995.
M. Gorbet and M. Orth; "Triangles: Design of a Physical/ Digital Construction Kit"; *Proceeding of DIS '97*; Mar. 22–27, 1997.
Anon.; "Intelligent Building Blocks"; AJ Jan. 30, 1985; pp. 47–54.

* cited by examiner

Primary Examiner—Eric Coleman
Assistant Examiner—Kandasamy Thangavelu
(74) Attorney, Agent, or Firm—Dirk Brinkman; Andrew J. Curtin (57) ABSTRACT

In a self-configuring store-and-forward computer network, a plurality of processors are each housed in an enclosure having a top surface and a bottom surface. Each processor has an associated block identification number. An array of m by n radially symmetric connectors are arranged on the top surface and on the bottom surface of each enclosure. Each connector has an associated connector identification number. The connectors physically and electronically couple the plurality of processors as a three-dimensional structure. Communications controller in each of the processors exchange the block and connector identification numbers between the processors and a host computer to determine an ordered list of connector numbers that is used to route messages between any of the processors and the host computer.

11 Claims, 14 Drawing Sheets

SELF-CONFIGURING STORE-AND-FORWARD COMPUTER NETWORK

FIELD OF THE INVENTION

This invention relates generally computer networks, and more particularly to store-and-forward networks.

BACKGROUND OF THE INVENTION

In U.S. Pat. No. 4,275,449 "Modeling Arrangements," Aish describes a set of building blocks as a computer input device for architectural applications. The blocks were geometric solids with connectors on some of the faces, and could be changeably interconnected to form different modeling arrangements whose geometric structure could be read by a computer. Each block had an identifier, which when used as an index into a file of information about the blocks, permitted 3-D renderings to be made of the physical model. Aish devised an approach to reading out the structure of a modeling arrangement that kept the circuitry in each block to a minimum. A host computer directed a search of the structure, selecting one block at a time. That block's identity was read, then neighbors detected and control passed from that block to a neighbor, and so on, until an exhaustive search of the structure had been completed.

Evans, in "Intelligent Building Blocks," Architect's Journal, Jan. 30, 1985, pp. 47–54, mentions that other information, such as material properties and costs, could also be associated with such blocks, permitting the computer to prepare various architectural analyses and reports about the modeled structures.

Frazer, in "An Evolutionary Architecture," Architectural Association, 1995, describes a more ambitious series of prototypes of machine-readable modeling tools. In general their approach to reading the modeling structure followed Aish's, although they tried several different kinds of building elements, and used them for a variety of applications. In one embodiment, each of Frazer's blocks had eight bits of state reflected in eight LEDs that could be controlled by a host computer. One of the blocks was equipped with six mercury tilt-switches to determine the orientation of the entire model. Another block had magnet-sensitive reed-switches embedded in external cladding panels. As the computer came to poll that block for its identify, the state of these switches could affect the result in a way that would in turn affect the virtual model's rendered appearance.

Frazer also developed a modeling kit whose elements corresponded to the components used in kits for building actual modular homes. The miniature modeling kit included a variety of elements such as wall panels, doors and windows. Software on the computer drew plans, gave feedback on planning errors, estimated costs and energy consumption, etc.

Dewey et al., in "Geometry-Defining Processors for Partial Differential Equations," B. J. Alder (ed.) "Special Purpose Computers," Academic Press, 1988, pp. 67–96, describe a set of 3-D blocks similar to some of those built by Frazer's group, but with a different application in mind. The motivation for their geometry-defining processors was to build a re-configurable parallel computer for finite-element simulations of systems studied in mechanical engineering. Thus, the connection geometry of the parallel processing elements could match the geometry of the underlying physical system being modeled, and thereby use the available communications bandwidth more efficiently. Because the principal goal was engineering computation, each building element contained a commercially available microprocessor.

Other related work is described by Gorbet et al. in "Triangles: A Physical-Digital Construction Kit," Proceedings of Designing Interactive Systems: Processes, Practices Methods and Techniques, August 1997, pp. 125–128, and in "Triangles: Tangible Interface for Manipulation and Exploration of Digital Information Topography," Proceedings of CHI 98, April 1998, pp. 49–6. In the "Triangles" system, the basic building elements are triangles. Each triangle is a planar, plastic equilateral triangle with an embedded microprocessor. The triangles connect to each other physically and digitally with magnetic, electrically conducting connectors. When connected to each other, the triangles can be tiled on a flat surface, or folded over into more complex surface topologies. When the triangles are connected, information about their identities is exchanged, and messages can be relayed to a host computer. In this way, an application running on the host can determine relationships between the connected pieces, and specific connections can trigger specific digital events. Typical applications include visual programming, visual scripting, and pattern formation.

Key attributes desired of self-describing construction kits include: scalability—the ability to build large structures containing hundreds of building elements, configurability—the ability to connect building elements in rich and varied ways, interactivity—the ability to interact physically and electrically with a constructed artifact, and presentation—the ability to design customized and stylized visual and physical interpretations of constructed artifacts. Known prior art building block systems lack integrated solutions that address these key attributes.

SUMMARY OF THE INVENTION

Only skilled people know how to use graphics modeling packages, such as a CAD/CAM system, but everyone can build things out of blocks. Starting from this premise, and with the goal of developing accessible modeling tools for building and populating virtual worlds, the invention provides a novel object-modeling system. The system includes building blocks that self-describe the geometric structures into which they are assembled. Each building block contains a microcontroller, and can communicate with the other blocks to which it is physically connected.

The invention provides a novel architecture for a distributed computer system comprising self-describing building blocks with embedded microprocessors (microcontrollers). Each self-describing building block is formed of an enclosure having a top surface and a bottom surface. An array of m by n radially symmetric connectors are arranged on the top surface and on the bottom surface of the enclosure, wherein both m and n are greater than one if a rigid structure is required. The connectors are configured to carry power and data signals. A microcontroller, including a memory, is mounted in the enclosure. The microcontroller is coupled to each of the connectors. The microcontroller includes communication means for exchanging data messages using any of the connectors.

The connectors enable a plurality of the blocks to be arranged in as a three-dimensional structure. This structure can be recovered by a distributed computation performed by the blocks, and passed to a host computer. The host computer can make the structure available for various applications, including virtual-reality computer games, information management for buildings, and artistic expression.

From the collected block connectivity data, and presorted or editable block attributes, the host can recover the geometric structure of the assembled blocks. The structure can then be rendered in various styles, ranging from a literal rendition, to decorative interpretations in which structural elements are identified automatically and augmented appropriately. After being rendered, the virtual models are available for viewing and manipulation by the user. The automatically decorated models can also be "replicated" using 3D stereolithography.

After the block connectivity data has been collected, each block can communicate with the host, and with the other blocks using a store-and forward protocol. Sensors in the blocks can report their status, and transducers such as lights, speakers, motors, etc., can be controlled. For example, the blocks can be assembled into a model of an actual building, with sensors in the model being used to control the lighting in the building, and sensors in the building being used to control the corresponding lights in the model.

The geometric arrangement of the blocks, as well as sensor data, and transducer controls can also be shared over a network, e.g., the Internet, permitting collaborative design, remote monitoring, and multi-user game playing, for example.

In contrast to the prior art, our system concurrently achieves scalability, configurability, and interactivity, as well as a unique capability to enhance constructed artifacts through automatic, intelligent decoration. This is accomplished using a physical form factor that allows a rich and varied connectivity of building elements; a microprocessor-based, distributed, packet-switching architecture that facilitates efficient and robust computation of connectivity, and the autonomous operation of building elements during interactive use; and the automatic interpretation of constructed artifacts for the purpose of visual and physical decoration.

DETAILED DESCRIPTION OF PREFERRED EMBODIMENTS

Block Structure

Figure 1:
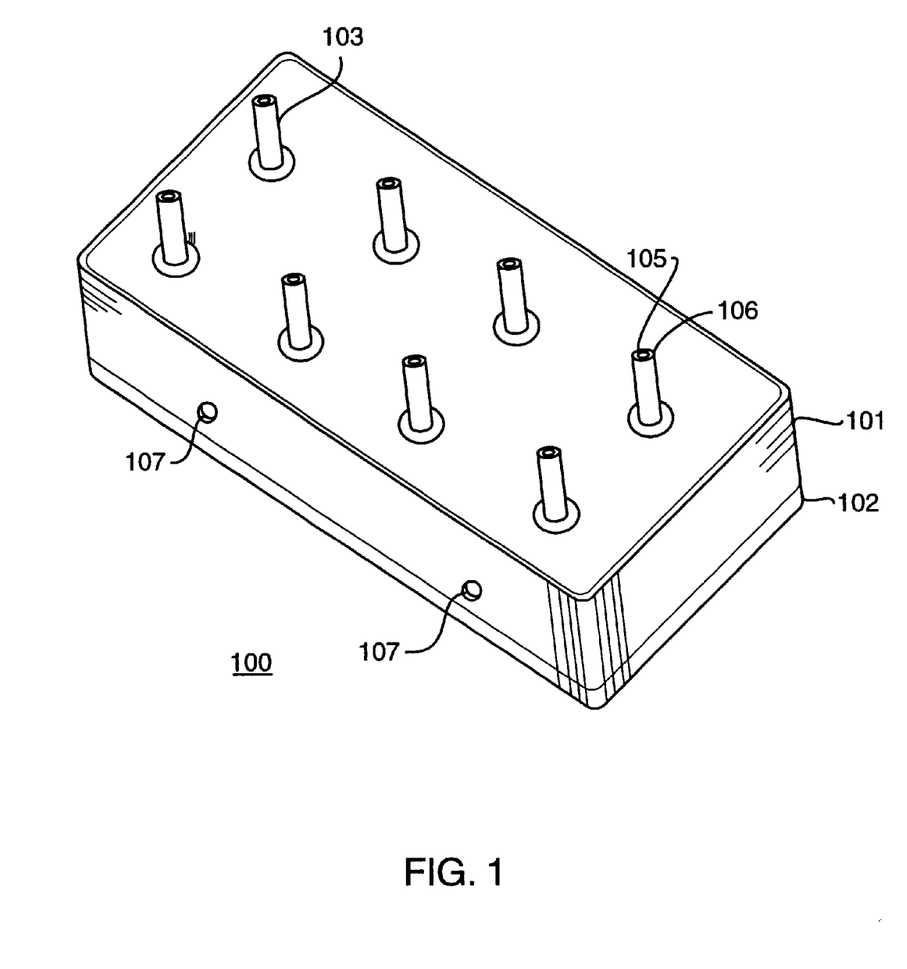
FIG. 1 is a top perspective view of a construction element or building block according to the invention.
Figure 2:
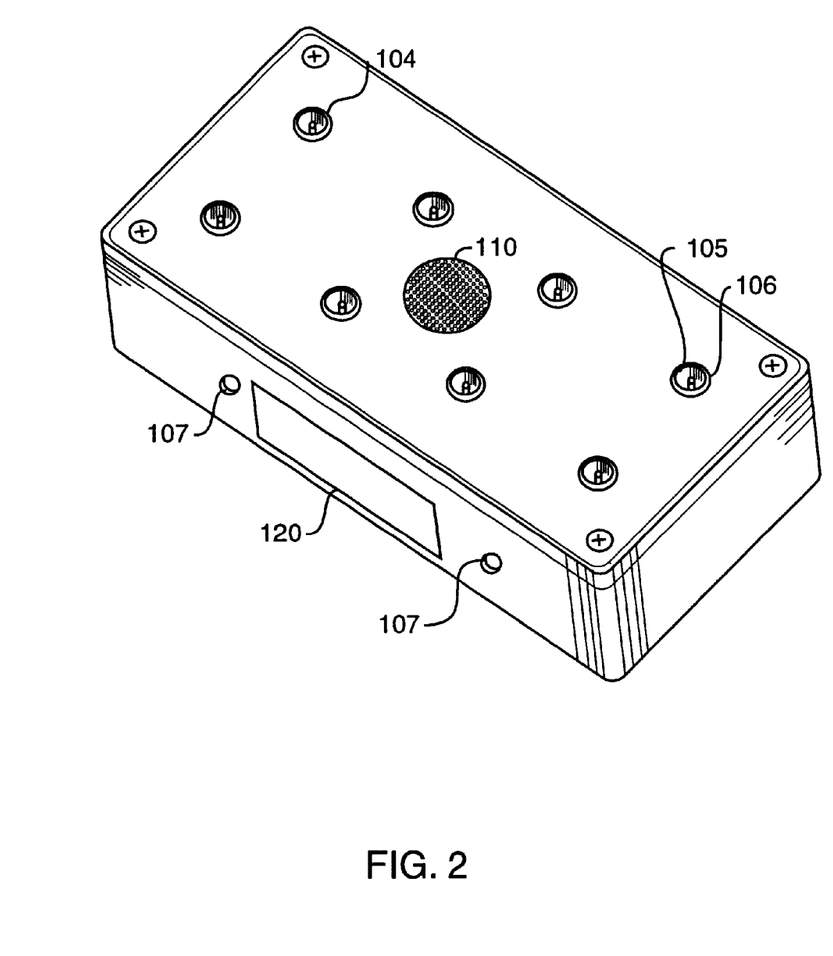
FIG. 2 is a bottom perspective view of the block of FIG. 1.

FIGS. 1–2 shows a construction element 100 according to our invention.

FIG. 1 is a top view, and FIG. 2 is a bottom view. The element 100 is in the form of a 2×4×2 building block. Here, 2×4×2 refers to the arrangement of the sixteen connectors on the top and bottom of each block. It should be noted that in general the invention admits any m×n a array of connectors on the top and bottom of the block. However, to form a rigid structure both m and n need to be greater than one.

Each block has a unique block identification number (BID), and each connector has an associated connector identification number ($CIN_1, \ldots, CIN_{16}$).

The block 100 is a two-part plastic enclosure having a top part 101 and removable bottom part 102. The parts can be fixed together with screws. Holes are formed in the top and bottom to mount connectors 103–104.

The eight top holes are for plugs 103 ($CIN_1, \ldots, CIN_8$), and the eight bottom holes mount jacks 104 ($CIN_9, \ldots, CIN_{16}$). To allow the blocks to be connected together in a wide range of orientations, we make the connectors radially symmetric, for example, round.

The dimensions of the blocks (m×n), and the locations of the radially symmetric plugs and jacks are such that multiple blocks can be arranged into the same kind of 3D structures that one could create with LEGO™ building blocks.

Each of the connectors 103–104 has two conductors (lines). However, instead of using one conductor for power and one for ground, which is the normal usage for a DC power connector, we use an inner conductor as a signal line 105 for bi-directional data communications, and an outer conductor or sleeve 106 for power distribution. In an alternative embodiment described below, a single conductor is used for both power and data signal. In this case, the power signal is modulated to carry the signal.

The outer conductors 106 are wired so that adjacent connectors alternate power and ground signals on their outer sleeves, in a pattern similar to one described in U.S. Pat. No. 4,883,440 "Electrified Toy Building Block with Zig-Zag Current Carrying Structure" issued to Bolli. Thus, every block will have at least one connection to power and one to ground in any typical structure built with the blocks.

Figure 11:
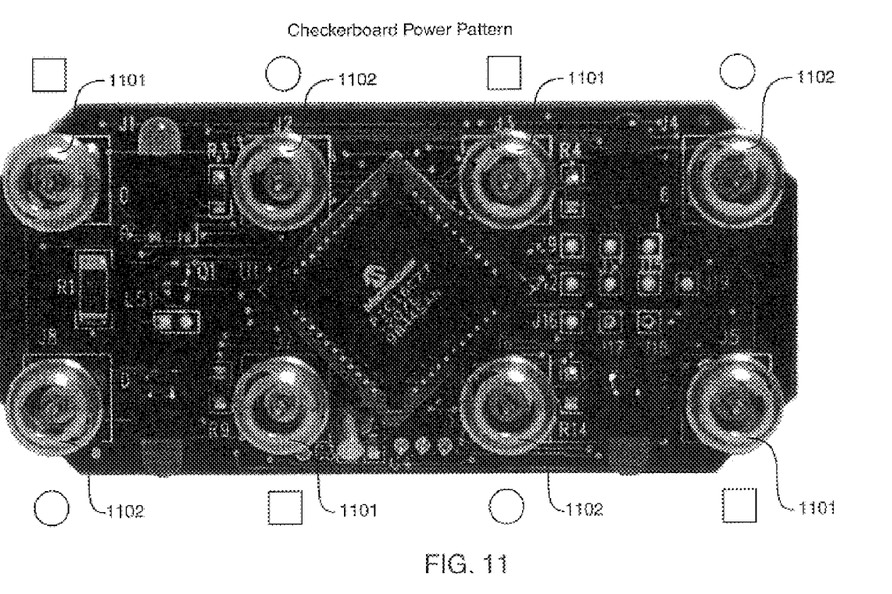
FIG. 11 illustrates a checkerboard signaling pattern.

When the blocks are connected, there is no way to tell a priori which sleeves are connected to power and which sleeves are connected to ground. We solve this problem as shown in FIG. 11. All of the sleeves for one of the polarities 1101 are connected to one of the inputs of a full-wave bridge rectifier 320, see FIG. 3, and all of the sleeves for the other polarity 1102 to the other input of the rectifier 320. The output of the bridge rectifier is a supply voltage with a known power and ground polarity. Note that there is a voltage drop as the power passes through the full-wave bridge rectifier 320 and as power passes through the connectors 103 and 104.

Figure 3:
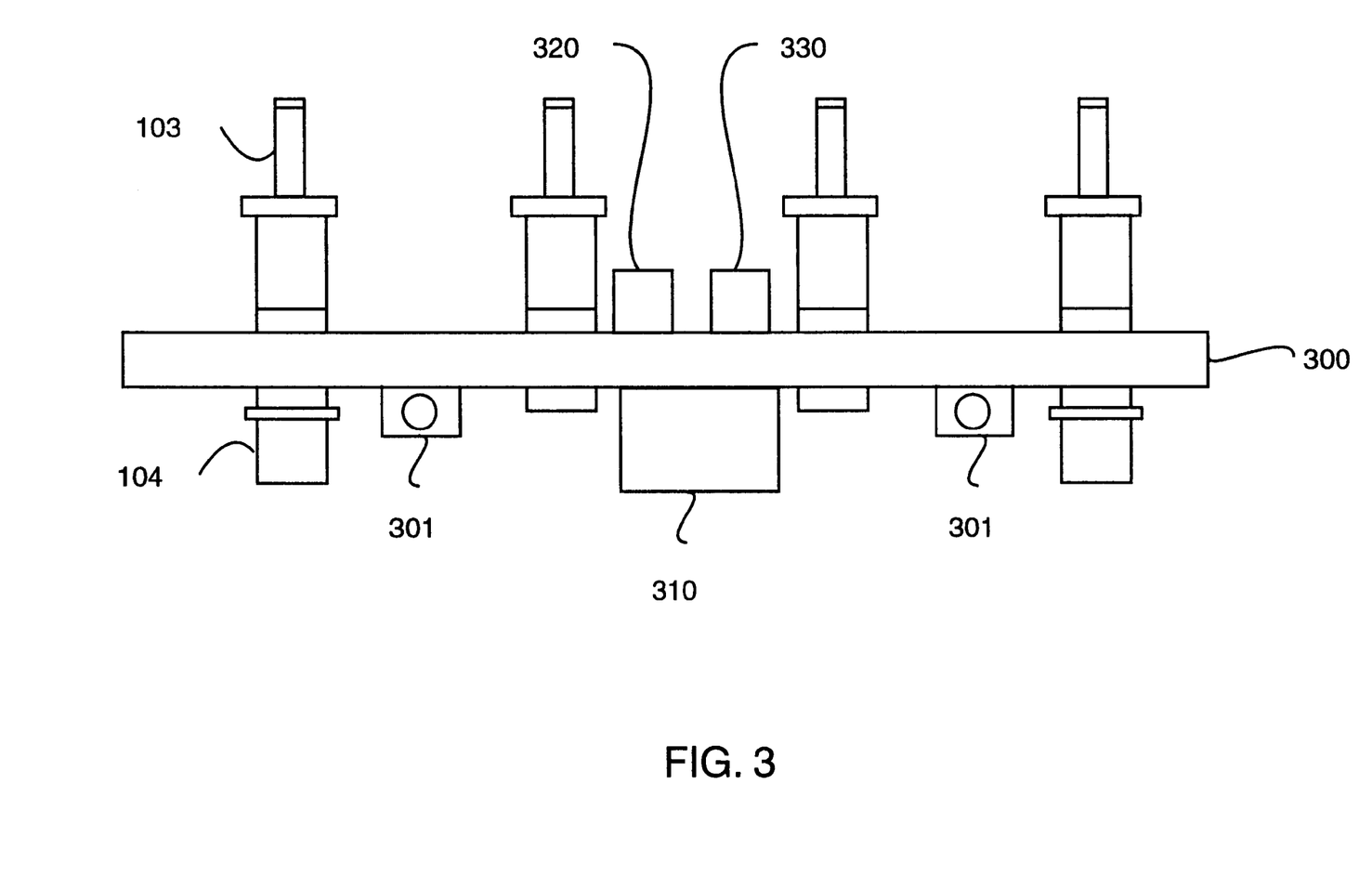
FIG. 3 is a side view of a circuit board mounted in the block of FIGS. 1 and 2.

This supply voltage is then fed into a voltage regulator 330 that outputs correctly regulated power for the integrated circuits used within the block's circuitry. The voltage regulator ensures that the correct voltage is supplied to the circuitry independent of the input voltage to the regulator, so long as voltage is sufficiently high. This allows higher voltage, unregulated power to be distributed from block to block. This in turn allows a greater distance from the power source to the power consumer, and thereby enabling the construction of larger structures.

Data communication according to our invention, described in greater detail below, is done without the use of a global communication bus. Instead, we use a message passing protocol via the signal lines 105.

Two holes 107 are formed in each side of the block. A light emitting diode (LED) is mounted behind each hole so that there is a visual indication of the block's operation.

As shown in a side view in FIG. 3, a circuit board 300 is mounted in the block 100. The connectors 103–104 are fixed to the circuit board, as are the LEDs 301. The connectors form the physical mounting basis for the circuit board. A microcontroller 310, the rectifier 320, and the voltage regulator 330 are mounted on the board. We use a Microchip™ Technology Inc. PIC16C77 microcontroller. The microcontroller includes a random access memory. The board 300 also includes pads for the connector plugs and jacks, and assorted analog elements, i.e., resistors, capacitors, and a crystal to generate the clock for the microcontroller.

Several pads in the periphery of the circuit board are left open to accommodate additional transducers and sensors inside the block, such as a speaker 110 shown in FIG. 2, motors, RF, IR, ultrasound, and microwave transmitters, LED, LCD, CRT, and other display devices, cameras, microphones, proximity, presence, motion, and touch sensors 120, RF, IR, ultrasound, and microwave receivers, and the like. Alternatively, the current board can be trimmed to fit inside a 2×2×2 building block without affecting its basic functionality.

The microcontroller 310 has thirty-three I/O pins of which sixteen are used for data communication via the signal lines of the connectors. The microcontroller includes an eight-bit RISC CPU, 8K of 14-bit words of read-only program memory (PROM), 368 8-bit bytes of data memory (RAM), a hardware Universal Synchronous/Asynchronous Receiver/Transmitter (USART), and interrupt handling. The data memory is used to store temporary data and connectivity information during operation.

We program the controller in assembly language to achieve execution efficiency, and to save code space. At startup, the program and data in each block's microcontroller are identical other than the block's unique identification number (BID).

Operation of Assembled Structure

The operation of our invention is described with reference to FIG. 4a. An arbitrary number of blocks are connected to each other to form some three-dimensional structure 400. Because of the constructive versatility of the blocks having an m×n array of radially symmetric connectors, a pair of 2×4×2 blocks can be connected in 184 different configurations, and one 2×4×2 block can be connected to as many as twelve others.

The geometry of the three-dimensional structure is determined using a message-routing protocol. The low-level details of the protocol are described below. At a high level, the protocol operates in three phases. Phase 1 determines connectivity, Phase 2 determines plug-to-jack correspondences, and in Phase 3, the connectivity database is sent, or "drained," to, for example, a host computer 480. The procedures that comprise the three phases operate in parallel 499 in the various blocks. The host computer can be a PC, workstation, or the like.

After these three phases have completed, the bricks enter a final phase known as Phase R ("R" for Routing). This phase allows the blocks to communicate with each other or with the host, and for the host to communicate with the blocks. The blocks function as general-purpose network routers and are also able to autonomously determine the state of sensors and alter the state of transducers during this phase.

Phase 1

Operation commences when we supply a power and ground signal on lines 401–402 to a drain block 403, described below. From the drain block(s), power is distributed to all of the blocks. When the blocks are powered on, they immediately enter Phase 1 (410). During Phase 1, the blocks determine their connectivity 411 in parallel. Lacking a global communication bus, the switching on of power is the only source of synchronization, which is necessarily approximate because of small delays in propagating power throughout the entire structure.

All 16 signal lines of each block, i.e., 8 connectors 103 on top and 8 connectors 104 on the bottom, are normally held high by pull-up resistors. Phase 1 is initiated by having each block pull its top signal lines (those in the plugs) low in response to the power signal.

Each block then tests its bottom signal lines (the lines 105 in the jacks 104) to determine and store which have been pulled low by some other connected block. After a short delay, to ensure that the approximately synchronized blocks do not try to drive shared signal lines simultaneously in both directions, this test is repeated with the roles of the top and bottom signal lines reversed.

Thus when Phase 1 completes, each block has identified in parallel which of its signal lines are connected, i.e., which connectors are attached to other blocks, but not to which specific other blocks or connectors.

Phase 2

After another short delay, each block enters Phase 2 (420). This phase has a first bottom-to-top half, and a second top-to-bottom half. During this phase, blocks communicate with neighboring blocks over the connected signal lines identified in Phase 1 to determine plug-to-jack correspondence information. At the start of the first half of Phase 2, each block first listens on its connected bottom signal lines for transmitted messages that contain the BID of the transmitting block, $BID_T$, and the connector number (CIN) of the connector over which that block is transmitting, $CIN_T$.

Note, transmitted messages may be missed when the receiving block is busy when transmission commences. Electrical interference, or noise, may also corrupt a message. Therefore, all messages are transmitted using a check-summed, acknowledged protocol, and unacknowledged transmissions are retried a predetermined number of times after appropriate timeouts.

The receiving block stores the message content along with its own BID number, $BID_R$, and the connector number over which it received the transmission, $CIN_R$, in its memory, e.g., ($BID_T$, $CIN_T$, $BID_R$, $CIN_R$). This dataset forms a complete record of a single connection between two blocks. A database 450 of these records stores the local connectivity information in each block.

After a block has successfully received transmissions on all of its connected bottom lines, it begins transmitting on each of its connected top lines, iterating in order of its connector numbers. Connectivity information therefore flows initially through the block structure from bottom to top, with the potential for significant parallel communication. At the completion of this parallel procedure, each block knows to which connector of which block each of its own bottom connectors is attached.

The procedure is repeated during the second half, but with blocks listening on their top connected lines and transmitting on their bottom connected lines. Thus at the end of Phase 2, each block has acquired and stored in its memory complete knowledge about all of its connected lines: the BIDs of the connected pair of blocks, and the corresponding connector numbers by which they are attached.

Each connected line that is processed successfully in Phase 2 is designated as valid; unconnected lines are deemed invalid.

Phase 3

In Phase 3 (430), the connectivity information (BIDs and CINs) is communicated to a host computer via the drain block 403, which includes a serial communication connection to the host computer. In addition to mediating communication between a block structure and the host, the drain also supplies power to the connected blocks, and may be attached to any part of a block structure. In other words, the drain can be configured as block 100 with a serial connection.

During Phase 3, all blocks listen on all of their valid lines for messages. When a request-to-drain message is received by a block on a particular connector, that connector is designated a "drain" connector. The request-to-drain message can be generated by the drain block 403 and first sent to some block connected to it, or the request-to-drain message can be generated by the host computer and first sent to the drain block 403. Beginning with Phase 3, a drain block functions by reliably forwarding messages to a block connected to it; its existence is transparent to the algorithm. In response to receiving the request-to-drain message, a block transmits connectivity messages containing all stored plug-to-jack correspondence information 421 on its "drain" connector, the one from which it received the request-to-drain message.

After the block has successfully completed transmitting the connectivity messages, the block forwards the request-to-drain message on a valid line with the lowest connector number, and the block enters a message-forwarding mode.

If the block receives a connectivity message in response to forwarding the request-to-drain message, then the block forwards that message on its drain connector. If the block receives any subsequent request-to-drain messages, then the block responds with a done message. If the block receives the done message, then the block forwards the request-to-drain message on a valid line with a higher connector number. If all valid lines have been processed, then the block sends a done message on its drain connector.

As stated above, the first request-to-drain message can be injected into the structure 400 by the drain block 403. The requests then percolate through the block structure in a preorder, depth-first traversal. Although this traversal is performed sequentially, that is, with only one block draining at any point in time, the forwarding of messages towards the drain is pipelined, thereby achieving parallelism in this phase as well.

At the end of Phase 3, the host 480 has complete connectivity information for the block structure. In fact, the host has redundant connectivity information, because each connection is reported twice, once by each of the two connected blocks. This redundancy contributes to the robustness of the system, but it can be eliminated for efficiency by eliminating the second half of Phase 2. Because block structures are rigid, their geometry can be inferred deterministically from complete connectivity data. Using geometrical data so inferred, various renderings of block structures can be computed, as described below.

Phase R

Phase R (440) implements a scalable and responsive approach to providing interactivity. Blocks autonomously report events, rather than being polled for state changes. Using the route-to-drain found in Phase 3, messages about events are communicated in a store-and-forward fashion through a chain of blocks to the drain block, and on to the host.

In Phase R 440, blocks listen for general-purpose messages. Each message is check-summed, and successfully received messages are acknowledged. After a timeout, an unacknowledged message is retransmitted until successfully acknowledged.

Figure 4A:
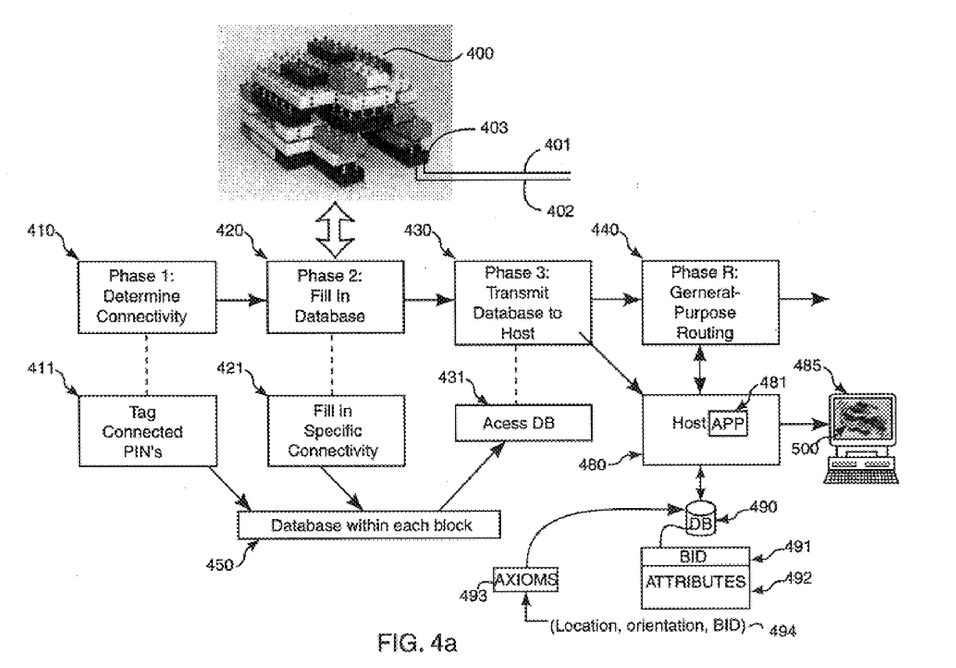
FIG. 4a is a flow diagram of the process used by the building blocks for determining the connectivity of an arrangement of blocks.
Figure 4B:
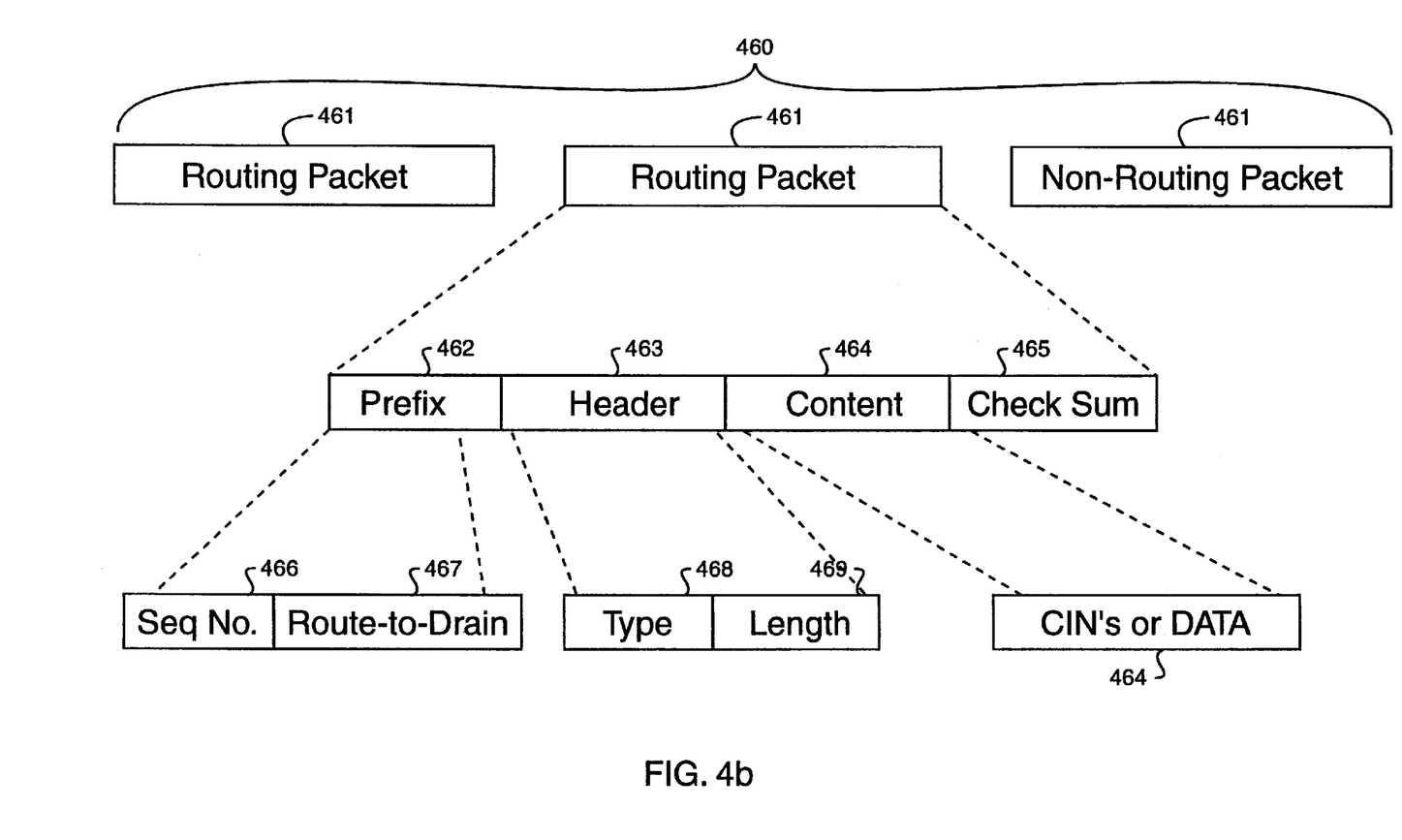
FIG. 4b is a block diagram of a message routed among the blocks.

As shown in FIG. 4*b*, messages 460 are composed of a sequence of packets 461. Each packet contains a prefix 462 which includes a packet sequence number 466 and an optional route-to-drain indication 467. The packet-sequence number is used to guarantee that packets are received successfully and in the correct order. If the route-to-drain indication is present, then the packet is forwarded to the receiving block's drain connector without further processing. Each packet also includes a header 463, content 464, and a checksum 465.

Phase-R packets are identified by packet type 468 in the header. The header also stores the length 469 of the packet. The accepted packet types include: (1) a Read/Write-RAM/registers packet, (2) a RAM/registers-contents packet, (3) an Alter-LEDs packet, (4) a Play-music packet, (5) a Route-packet-following-specified-path packet. This last packet type allows other packets to be sent to any other block.

The specified path is determined by listing a sequence of Connector Identification Numbers (CIN) over which the packet should be forwarded. Using a form of "worm-hole" routing, each block sets up a forwarding path to the first CIN specified in the list and then removes that CIN from the list that is forwarded to the next block.

Phase R monitors the state of attached sensors, and upon determining a change, autonomously sends a RAM/registers-contents packet to the host, using the route-to-drain indicator, to notify the host of the change. Thus, the host is made aware of the state of all sensors on all of the blocks all of the time. The host may send packets to specified blocks, using the Route-packet type, to cause the blocks to change the state of attached transducers. Thus, the host is able to control accessories attached to the blocks.

As shown in FIG. 4*b*, a message 460 is composed of one or more packets 461. Packets are composed of a sequence of separately synchronized bytes. Each packet contains an optional prefix byte 462, a message header 463, message-contents bytes 464, and a checksum 465. The prefix stores a sequence number 466 and a route-to-drain indication. The header stores a packet type 468 and a packet length 469. The content 464 can be routing information (CINs), or actual message-specific data.

Packets are acknowledged, and unacknowledged packets are retransmitted using an adaptive timeout algorithm. Packets are transmitted in a pipelined fashion. Thus, the system using the protocol, as described herein, emulates a self-configuring, store-and-forward computer network. This form of architecture facilitates transducers that require active control, such as speakers or motors, and sensors that require data buffering, such as microphones and cameras.

Graphic Rendering of Structure

As shown in FIG. 4*a*, the host 480 has access to a database (DB) 490. The database stores the BID 491 and attributes 492 for each block in the structure 400. The attributes can include shape, size, color, texture, and other physical or graphic information associated with the identified block. In other words, the attributes 492 can give the blocks additional characteristics. The attributes can be assigned when the blocks are given their unique BIDs. The database can be edited. This process is illustrated in FIG. 12.

Figure 12:
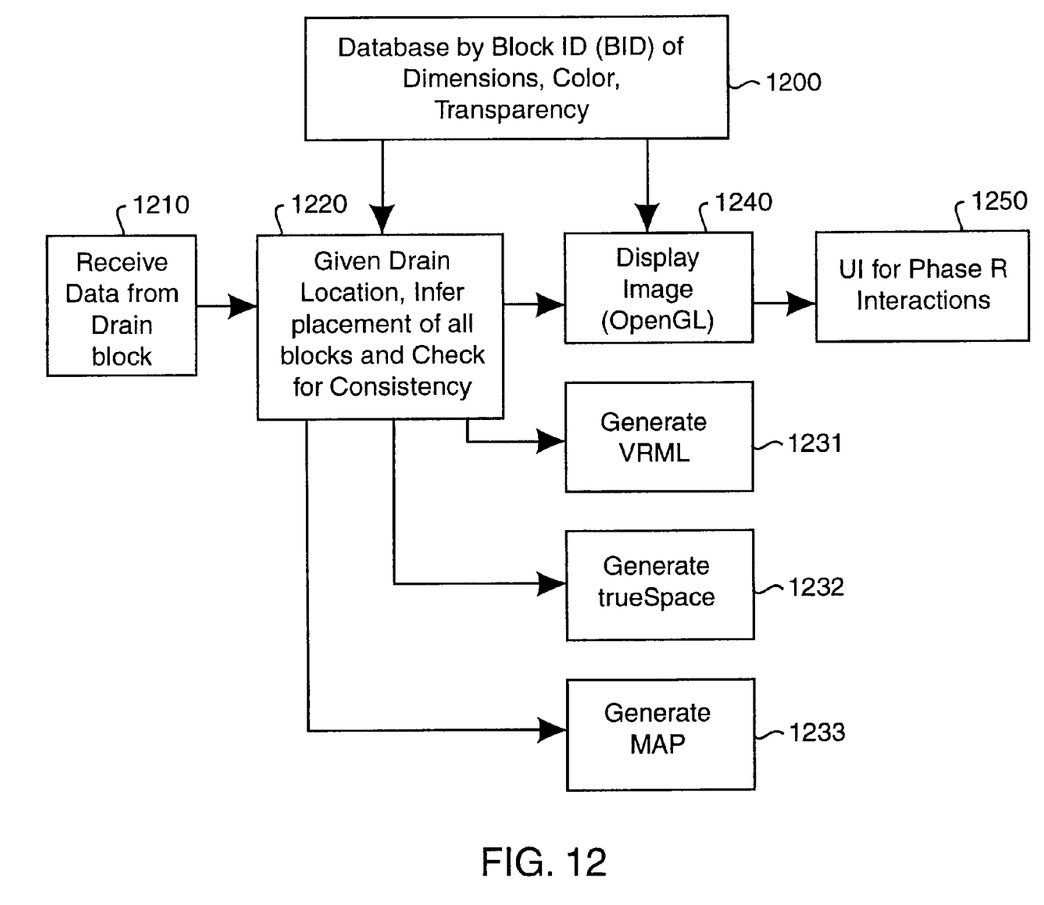
FIG. 12 is a flow diagram of a process for determining the connectivity of an arrangement of blocks.

In FIG. 12, a database 1200 stores the brick specific information. Connectivity information 1210 is received from Phase 3 as described above. Step 1220 infers the placement of the individual blocks. At this point, files 1231–1233, in various standard formats, describing the structure 400 can be generated.

Figure 5:
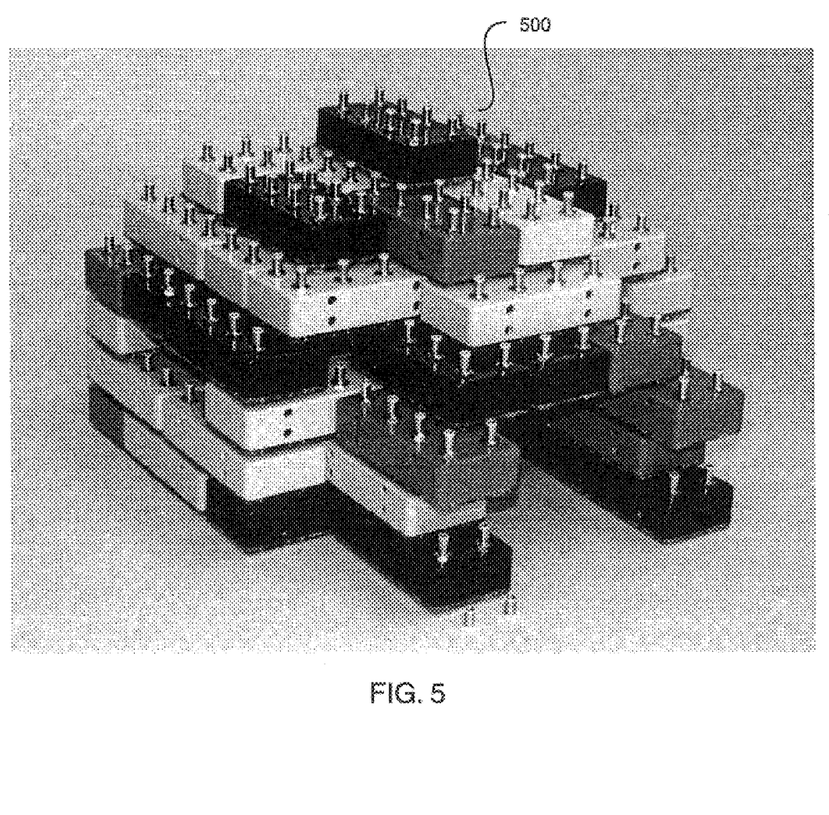
FIG. 5 is a perspective view of an arbitrary rigid arrangement of building blocks according to the invention.
Figure 6:
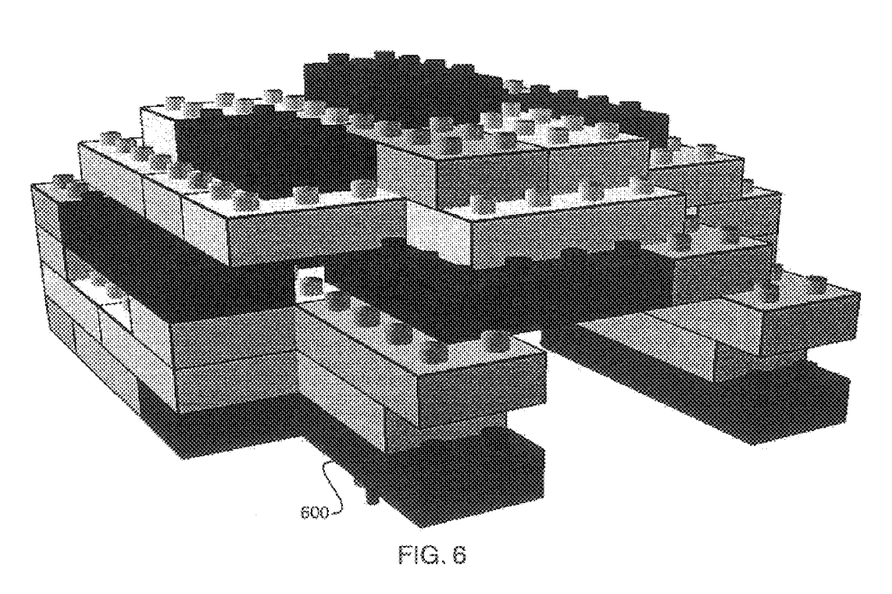
FIG. 6 shows a literal graphic rendition of the arrangement of FIG. 5.

A graphics-rendering application 481 executing on the host can now graphically render 1240 the 3-D geometry 500 of the structure on an output device 485, and a user can perform Phase R interactions 1250 via a user interface. The application 481 can be any common 3D modeling system. For example, FIG. 6 shows a graphic 600 generated by the host from the physical block structure 500 shown in FIG. 5. Note, that the rendered shape of the blocks can be different from the physical shape of blocks 100. For example in FIG. 6, the blocks are made to look like LEGO™ blocks.

Figure 10:
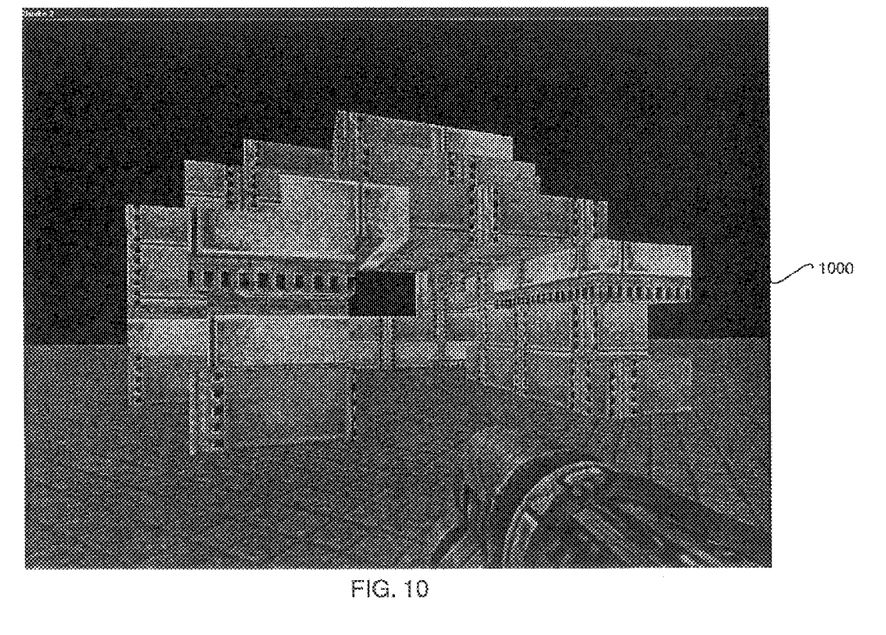

In FIG. 10 the same structure 500 has been incorporated as a building 1000 in the well-known Quake™ game. In this rendition, it actually becomes possible to "navigate" through the structure in a virtual-reality environment. In this case, the attributes given to the blocks include game effects, such as explosive walls, trap doors, electrified walls, etc.

Decorative Rendering

In addition, we generate a description of the block structure as a set of logical axioms 493 stored in the database 490 of FIG. 4a, one axiom to assert the location, orientation, and identification (494) of each block. These axioms can serve as input to a logic-program application written in, for example, the Prolog language, to identify larger scale structural elements of a block structure through unification-driven pattern matching, e.g., the walls and roof of the structure 500 when the structure is to be interpreted as a building, see Appendix A and B for detailed examples.

Other structural elements identified include windows, doors, corners, roof apexes, etc. Recognized structural elements can then be colored and textured distinctively, and decorated with additional ornamental geometry, to enhance the visual appearance of the rendered model.

Figure 7:
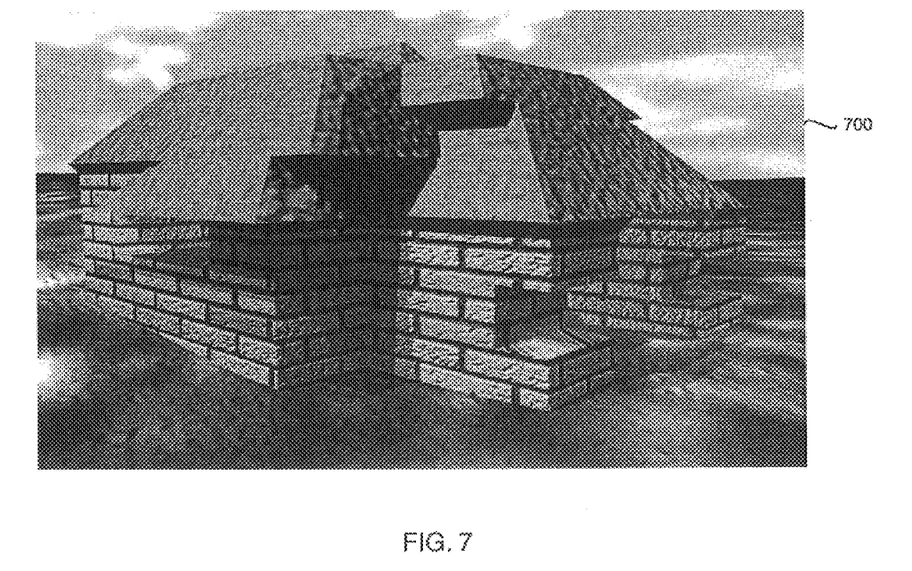
FIGS. 7–10 are alternative graphic renditions of the arrangement of FIG. 6.

In FIG. 7, the graphic 700 shows the identical physical structure rendered as a thatched roof cottage: note the brick texture, roof blocks modified to slope smoothly, and rendered with a mottled texture, and the additional fascia around the base of the roof.

Figure 8:
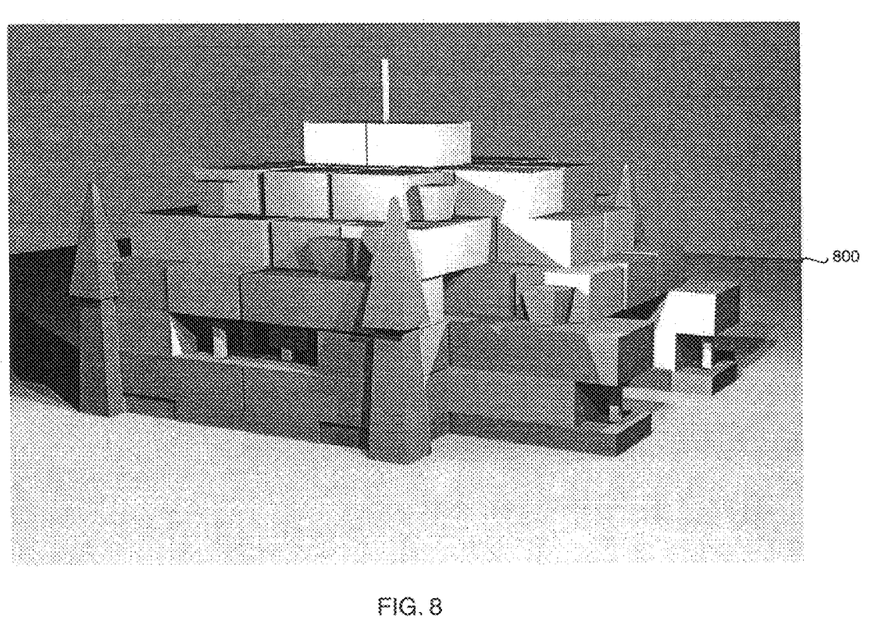

In FIG. 8, the same blocks are rendered as a castle 800. The crenellated walls are built out of randomly-shaped, colored blocks of stone to create a hand-made appearance. Bars have been placed in the windows. A flagpole has been placed at the apex of the roof, and red turrets have been added at the outside corners.

Figure 9:
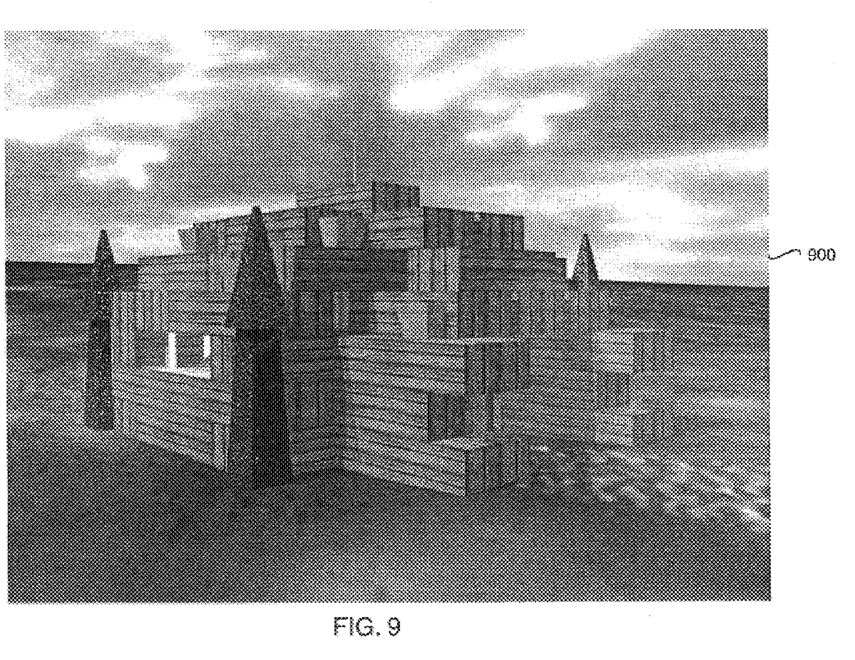

In FIG. 9, the same blocks 400 or 500 become a wooden fort 900.

The pattern-matching rules can be expanded to recognize more structural elements of buildings, and to support additional rendering styles. In addition, interpretive and decorative rules for other modeled artifacts, such as vehicles or organic forms, can be devised.

Once rendered in a decorative fashion, the augmented geometry of a structure can be transformed into an appropriate format for 3-D printing, e.g., via stereo lithography. Thus multiple decorative versions of a block structure can be realized physically.

Multi-World Interactivity

The blocks 100 can be equipped with proximity and touch sensors so that the user can interact with the blocks in real-time. Sensor data is conveyed to the host computer via the Phase-R protocol described above. Transducers in the blocks are also controlled via Phase-R messages.

Figure 13:
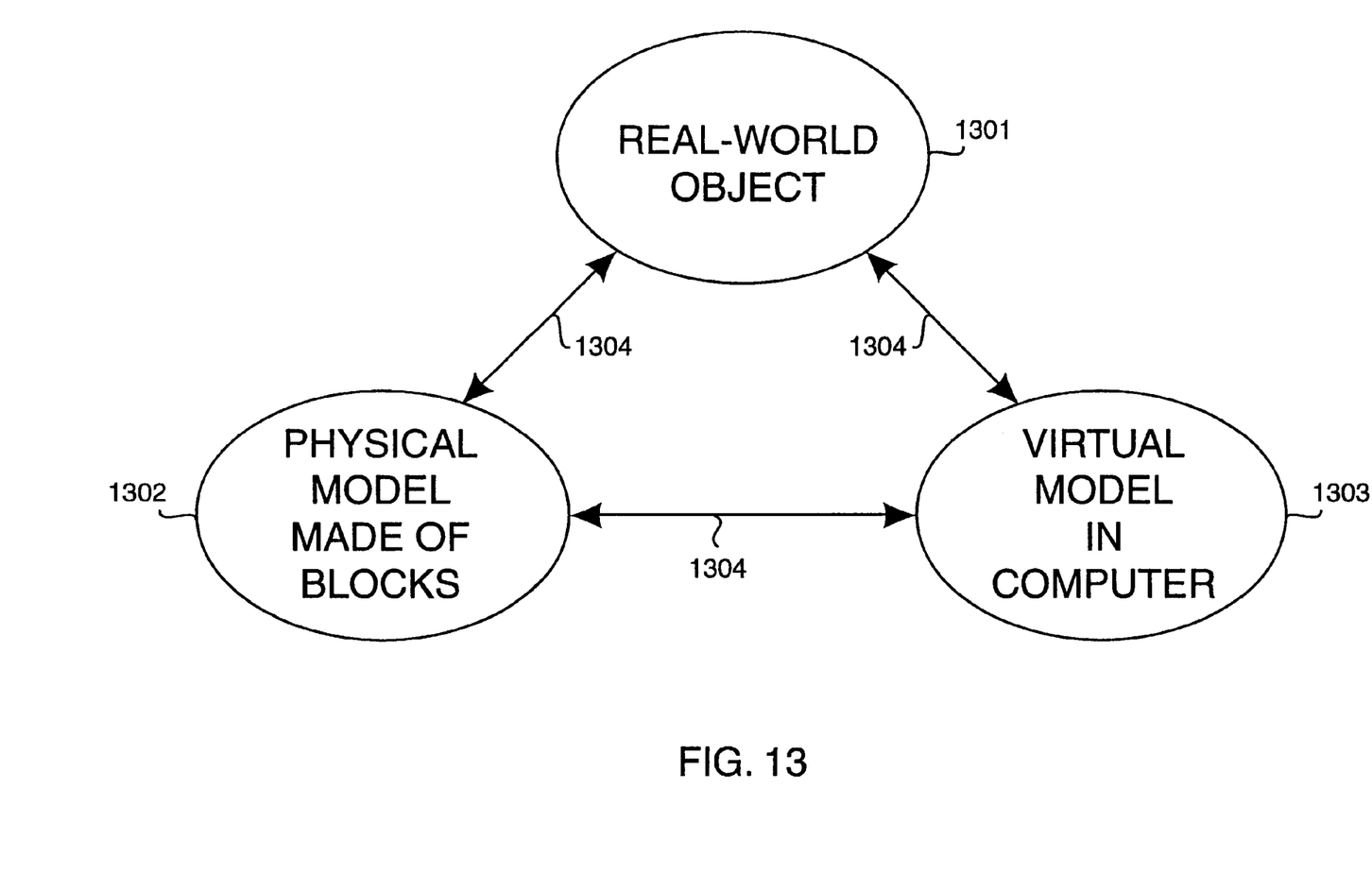
FIG. 13 is a diagram illustrating the interaction among a model world made from the construction elements, a graphic virtual world of the model world, and a physical work represented in the model and virtual worlds.

As shown in FIG. 13, these features make possible several monitoring and control applications that relate the real physical world 1301, a model world 1302, and a virtual world 1303 connected by a network 1304. For example, a block-structure model can be created for a real-world building. Virtual representations of the building can be viewed on a computer display. By manipulating switches or sensors on the block structure, aspects of the real-world building such as lights and thermostats can be controlled. The status of real-world sensors can be reflected in the block model, e.g., by turning on LEDs or activating the speaker. In both instances, state and behavior data can also be depicted in the virtual model. More generally, any change of state in any one of the worlds can be reflected in any other worlds.

It is to be understood that various other adaptations and modifications may be made within the spirit and scope of the invention. Therefore, it is the object of the appended claims to cover all such variations and modifications as come within the true spirit and scope of the invention.

We claim:

1. A self-configuring store-and-forward computer network, comprising:

a plurality of processors each housed in an enclosure having a top surface and a bottom surface, each processor having an associated block identification number;

an array of m by n radially symmetric connectors arranged on the top surface and on the bottom surface of each enclosure, each connector having an associated connector identification number, the connectors physically and electronically coupling the plurality of processors as a three-dimensional structure; and a communications controller in each of the processors for exchanging the block and connector identification numbers between the processors and a host computer to determine an ordered list of connector numbers that is used to route messages between any of the processors and the host computer.

2. The computer network according to claim 1 wherein the array includes two by four connectors.

3. The computer network of claim 1 wherein each connector carries a power signal and a data signal.

4. The computer network of claim 1 including, for each processor, a light emitting diode to provide a visual indication of an operation of the processor.

5. The computer network of claim 1 wherein the plurality of the processors are arranged in the three-dimensional structure, and further comprising:

means for determining a local connectivity information of each connectors of each enclosure in the three-dimensional structure in parallel;

means for determining adjacent connectivity information between adjacent processors in the three-dimensional structure in parallel; and communicating the local and adjacent connectivity information to a host computer coupled to one of the connectors of the enclosure of the three-dimensional structure.

6. The computer network of claim 5 wherein the three-dimensional structure is rendered by the host computer on an output device.

7. The computer network of claim 6 wherein the output device is a display terminal.

8. The computer network of claim 6 wherein the output device is a 3D stereo-lithographic printer.

9. The computer network of claim 5 wherein the connectivity information is incorporated into a virtual-reality environment.

10. The computer network of claim 5 wherein the connectivity information is expressed as logic axioms in a database.

11. The computer network of claim 1 wherein both m and n are greater than one to form a rigid structure.

* * * * *